(12) United States Patent
Zhou

(10) Patent No.: US 12,446,295 B2
(45) Date of Patent: Oct. 14, 2025

(54) SEMICONDUCTOR DEVICE

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 451 days.

(21) Appl. No.: 18/085,210

(22) Filed: Dec. 20, 2022

(65) Prior Publication Data

US 2023/0118901 A1 Apr. 20, 2023

Related U.S. Application Data

(62) Division of application No. 16/857,447, filed on Apr. 24, 2020, now Pat. No. 11,569,131.

(30) Foreign Application Priority Data

Apr. 24, 2019 (CN) .......................... 201910336097.6

(51) Int. Cl.
*H10D 84/03* (2025.01)
*H10D 30/01* (2025.01)
(Continued)

(52) U.S. Cl.
CPC ......... *H10D 84/038* (2025.01); *H10D 30/024* (2025.01); *H10D 30/62* (2025.01);
(Continued)

(58) Field of Classification Search
CPC .... H10D 30/024; H10D 30/62; H10D 64/017; H10D 64/258; H10D 84/013; H10D 84/0147; H10D 84/0158; H10D 84/834
See application file for complete search history.

(56) References Cited

U.S. PATENT DOCUMENTS 9,608,065 B1 3/2017 Bergendahl et al.
9,741,821 B1 8/2017 Ching et al.
(Continued)

FOREIGN PATENT DOCUMENTS

CN 109148296 A 1/2019
KR 10-2021-0098869 * 8/2021 ............. H10D 30/62

*Primary Examiner* — Mary A Wilczewski
(74) *Attorney, Agent, or Firm* — Anova Law Group, PLLC

(57) ABSTRACT

A semiconductor device is provided in the present disclosure. The semiconductor device includes a substrate, a plurality of fins formed on the substrate, a dummy gate structure formed across the plurality of fins and on the substrate, a first sidewall spacer formed on a sidewall of the dummy gate structure, an interlayer dielectric layer formed on a surface portion of each fin adjacent to the first sidewall spacer to cover a lower portion of a sidewall of the first sidewall spacer, and a second sidewall spacer formed on a top of the interlayer dielectric layer and covering a remaining portion of the sidewall of the first sidewall spacer. The top of the second sidewall spacer is coplanar with a top of the first sidewall spacer and the top of the dummy gate structure.

19 Claims, 5 Drawing Sheets

(51) Int. Cl.
*H10D 30/62* (2025.01)
*H10D 64/01* (2025.01)
*H10D 64/23* (2025.01)
*H10D 84/01* (2025.01)
*H10D 84/83* (2025.01)

(52) U.S. Cl.
CPC ......... *H10D 64/017* (2025.01); *H10D 64/258* (2025.01); *H10D 84/013* (2025.01); *H10D 84/0147* (2025.01); *H10D 84/0158* (2025.01); *H10D 84/834* (2025.01)

(56) References Cited

U.S. PATENT DOCUMENTS

| | | | |
|---|---|---|---|
| 10,872,980 B2 * | 12/2020 | Tsai | H01L 23/5283 |
| 11,569,131 B2 * | 1/2023 | Zhou | H10D 30/024 |
| 2014/0110798 A1 | 4/2014 | Cai et al. | |
| 2015/0108544 A1 | 4/2015 | Ching et al. | |
| 2015/0255571 A1 * | 9/2015 | Xu | H10D 64/017 257/288 |
| 2016/0111336 A1 | 4/2016 | Chang et al. | |
| 2016/0336412 A1 * | 11/2016 | Hung | H10D 62/151 |
| 2018/0175162 A1 | 6/2018 | Ching et al. | |
| 2020/0006151 A1 | 1/2020 | Kao et al. | |
| 2020/0091309 A1 | 3/2020 | Lin et al. | |
| 2020/0105613 A1 | 4/2020 | Hung et al. | |
| 2020/0135590 A1 | 4/2020 | Lai et al. | |
| 2020/0152509 A1 | 5/2020 | Greene et al. | |
| 2020/0303247 A1 | 9/2020 | Shu et al. | |
| 2020/0303261 A1 | 9/2020 | Shen et al. | |
| 2020/0343143 A1 | 10/2020 | Zhou | |
| 2020/0350417 A1 * | 11/2020 | Lin | H10D 84/0193 |
| 2020/0365697 A1 | 11/2020 | Li et al. | |

* cited by examiner

SEMICONDUCTOR DEVICE

CROSS-REFERENCE TO RELATED APPLICATION

This application is a divisional of U.S. patent application Ser. No. 16/857,447, filed on Apr. 24, 2020, which claims the priority of Chinese Patent Application No. 201910336097.6, filed on Apr. 24, 2019, the content of all of which is incorporated herein by reference in their entirety.

TECHNICAL FIELD

The present disclosure generally relates to the field of semiconductor manufacturing and, more particularly, relates to a semiconductor device and its fabrication method.

BACKGROUND

With the rapid development of semiconductor technology, semiconductor devices present a development trend of high element density and high integration level and are widely used as the most basic devices. Conventional planar devices have weak control on channel current, which may cause short-channel effect and leakage current, thereby affecting the electrical performance of the semiconductor devices.

In order to overcome the short-channel effect and control the leakage current, a fin field effect transistor (FinFET), which is a common multi-gate device, has been used in the conventional technology. The structure of the FinFET may include fins and an isolation structure on a semiconductor substrate surface where the isolation structure may cover a portion of the fin sidewalls, a gate structure across the fins and on the substrate, and a source region and a drain region in the fins on two sides of the gate structure.

However, with the size reduction of the semiconductor device and the device density improvement, the formed fin field effect transistor may have unstable performance.

SUMMARY

One aspect of the present disclosure includes a semiconductor device fabricated according to the embodiments of the present disclosure. The semiconductor device includes a substrate; a plurality of fins, formed on the substrate; a dummy gate structure, formed across the plurality of fins and on the substrate; a first sidewall spacer, formed on a sidewall of the dummy gate structure; an interlayer dielectric layer, formed on a surface portion of each fin adjacent to the first sidewall spacer to cover a lower portion of a sidewall of the first sidewall spacer; and a second sidewall spacer, formed on a top of the interlayer dielectric layer and covering a remaining portion of the sidewall of the first sidewall spacer. The top of the second sidewall spacer is coplanar with a top of the first sidewall spacer and the top of the dummy gate structure. The interlayer dielectric layer isolates the second sidewall spacer from an adjacent fin of the plurality of fins.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A semiconductor device and its fabrication method are provided in the present disclosure. The method includes providing a substrate; forming a plurality of fins spaced apart on the substrate; forming a dummy gate structure across the plurality of fins and on the substrate; forming a first sidewall spacer on a sidewall of the dummy gate structure; forming an interlayer dielectric layer on the substrate and the fins, and on a portion of a sidewall of the first sidewall spacer, where a top of the interlayer dielectric layer is lower than a top of the first sidewall spacer; and forming a second sidewall spacer on the interlayer dielectric layer and on a sidewall of the first sidewall spacer.

The parasitic capacitance between metal gates in a conventional formed semiconductor device may be relatively large. The large interference caused by the parasitic capacitance may lead to poor alternating current characteristics, thereby affecting the performance stability of the semiconductor device. The formation process may refer to FIGS. 1-5.

FIGS. 1-5 illustrate structural schematics corresponding to certain stages for forming an exemplary semiconductor device.

Figure 1:
FIGS. 1-5 illustrate structural schematics corresponding to certain stages for forming an exemplary semiconductor device.

Referring to FIG. 1, a substrate 1 may be provided.

Figure 2:
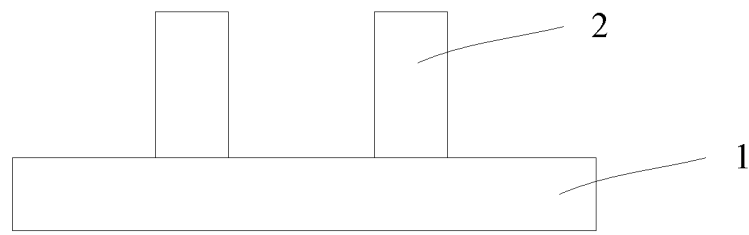

Referring to FIG. 2, a plurality of fins 2 may be formed on the substrate 1.

Figure 3:
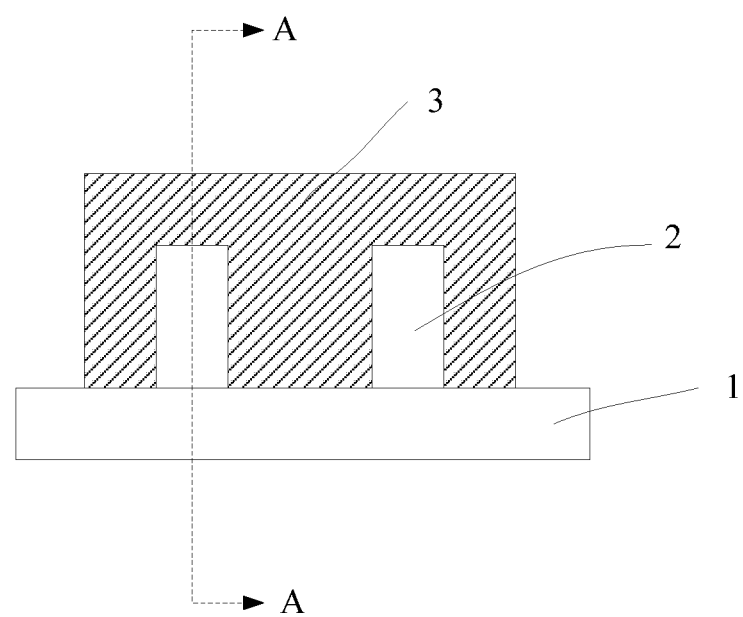
Figure 4:
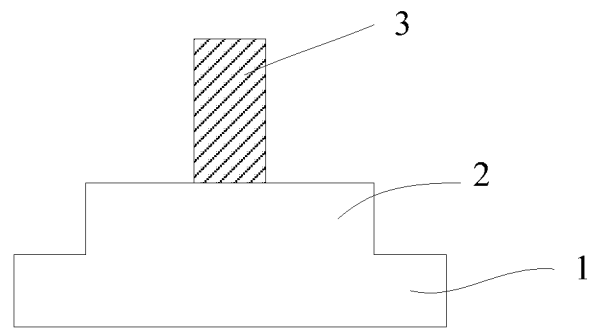

Referring to FIGS. 3-4, a dummy gate structure 3 may be formed on the substrate 1 and across the fins 2.

FIG. 4 is a cross-sectional view along a cross-sectional line A-A in FIG. 3.

Figure 5:
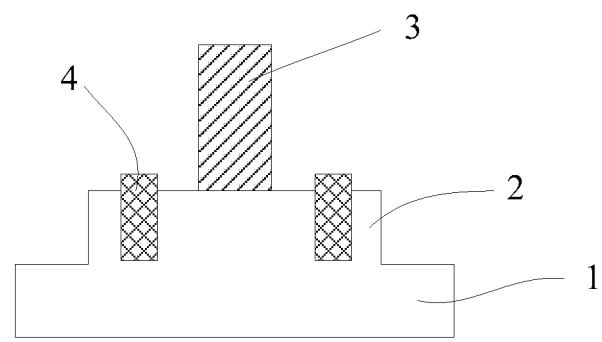

Referring to FIG. 5, a source/drain region 4 may be formed in the fins 2 on two sides of the dummy gate structure 3.

When the dummy gate structure 3 is removed to form a metal gate structure and a conductive plug is formed at the source/drain region 4 subsequently, the distance between the metal gate structure and the conductive plug may be too small and the parasitic capacitance between the metal gate structures may be too large. When the semiconductor device is in operational state, the interference effect caused by the parasitic capacitance may be large, so that the alternating current characteristics of the semiconductor device may be poor, and the performance stability of the semiconductor device may be affected.

After forming a first sidewall spacer on a sidewall of the dummy gate structure, an interlayer dielectric layer may be formed on the substrate, and a top of the interlayer dielectric layer is lower than a top of the first sidewall spacer. A second sidewall spacer may be formed on the interlayer dielectric layer and on a sidewall of the first sidewall spacer. When removing the dummy structure to form the metal gate structure and forming the conductive plug subsequently, the distance between the metal gate structure and the conductive plug may be increased due to the presence of the second sidewall spacer. In such way, when the semiconductor device is in operational state, the interference effect of the parasitic capacitance on the semiconductor device is smaller, and the performance and stability of the semiconductor device may be more desirable.

In order to further illustrate the above described objects, features, and advantages of the present disclosure, various specific embodiments of the present disclosure are described in detail with reference to the accompanying drawings hereinafter.

Figure 11:
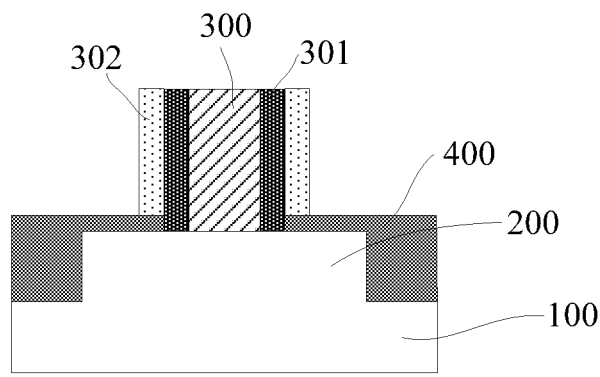
Figure 12:
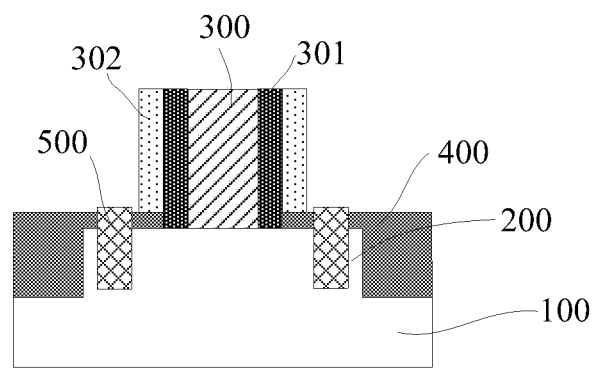
Figure 13:
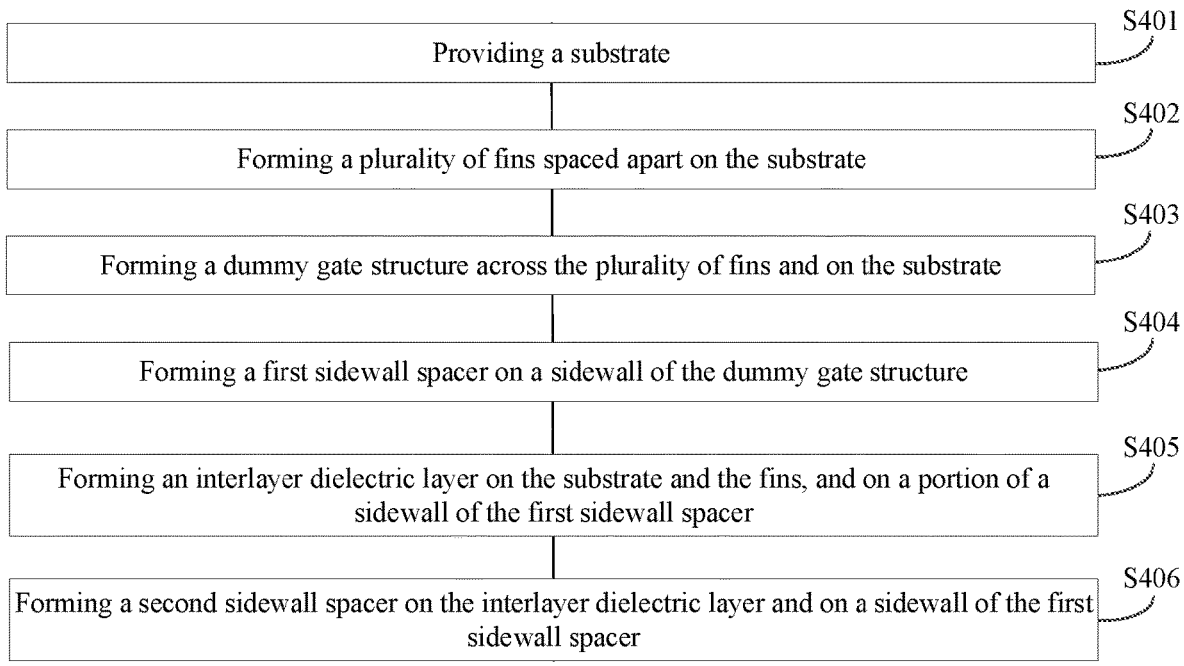
FIG. 13 illustrates a flowchart of an exemplary fabrication method for forming a semiconductor structure according to various disclosed embodiments of the present disclosure.

FIGS. 6-12 illustrate structural schematics corresponding to certain stages for forming an exemplary semiconductor device according to various disclosed embodiments of the present disclosure; and FIG. 13 illustrates a flowchart of an exemplary fabrication method for forming a semiconductor structure according to various disclosed embodiments of the present disclosure.

Figure 6:
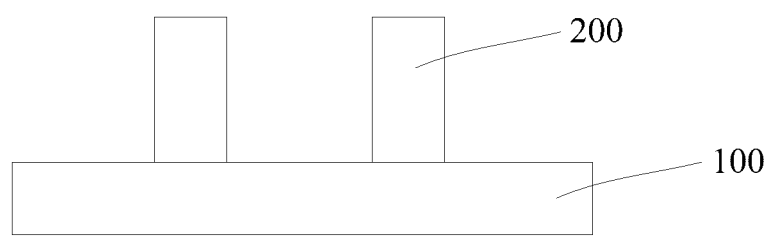
FIGS. 6-12 illustrate structural schematics corresponding to certain stages for forming an exemplary semiconductor device according to various disclosed embodiments of the present disclosure.

Referring to FIG. 6, a substrate 100 may be provided, and a plurality of fins 200 spaced apart may be formed on the substrate 100 (e.g., in S401 and S402 of FIG. 13).

In one embodiment, the material of the substrate 100 may be single crystalline silicon. In other embodiments, the substrate 100 may be made of a material including single crystalline silicon, polycrystalline silicon or amorphous silicon. The substrate 100 may be made of a material including silicon, germanium, silicon germanium, gallium arsenide, or any other suitable material(s).

The formation method of the fins 200 may include forming a fin material on the substrate 100 and patterning the fin material to form the fins 200.

The material of the fins 200 may be single crystalline silicon. In other embodiments, the fins 200 may be made of a material including silicon germanium, gallium arsenide, or any other suitable material(s).

In one embodiment, an isolation structure may not be formed on the substrate 100. In other embodiments, a dummy gate structure 300 may be formed, and the isolation structure may also be formed on the substrate 100 and cover a portion of sidewalls of the fins to isolate adjacent fins.

Figure 7:
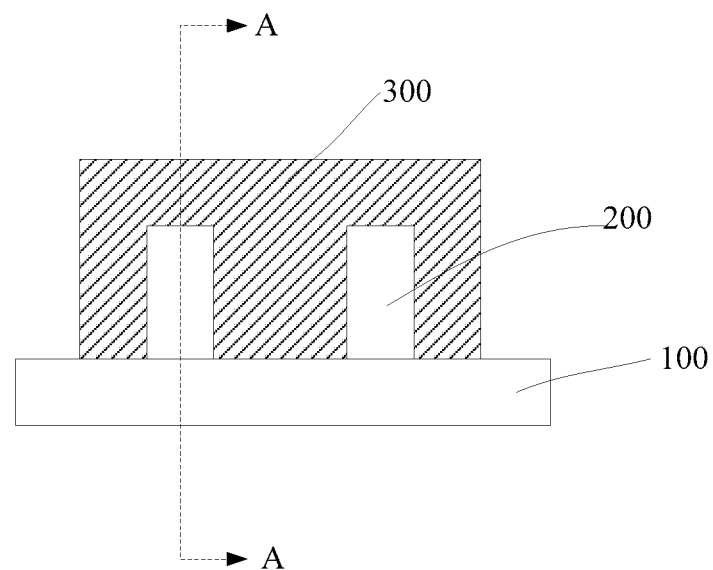
Figure 8:
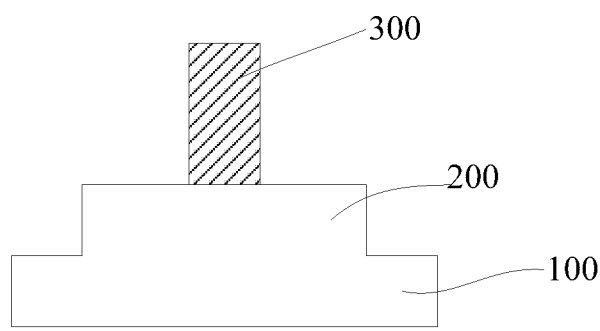

Referring to FIGS. 7-8, the dummy gate structure 300 may be formed over the substrate 100 and across the fins 200 (e.g., in S403 of FIG. 13).

FIG. 8 is a cross-sectional view along a cross-sectional line A-A in FIG. 7.

In one embodiment, a gate mask layer may not be formed on the top of the dummy gate structure 300. In other embodiments, the gate mask layer may be formed on the top of the dummy gate structure 300, thereby protecting the dummy gate structure 300.

In one embodiment, the dummy gate structure 300 may be formed by an existing process.

In other embodiments, when the isolation structure may also be formed on the substrate 100 and cover a portion of sidewalls of the fins to isolate adjacent fins, the dummy gate structure may across the fins 200 and be further located on a portion of the isolation structure.

In one embodiment, the dummy gate structure 300 may include a dummy gate dielectric layer and a dummy gate electrode layer, and a material of the dummy gate electrode layer may be polycrystalline silicon.

Figure 9:
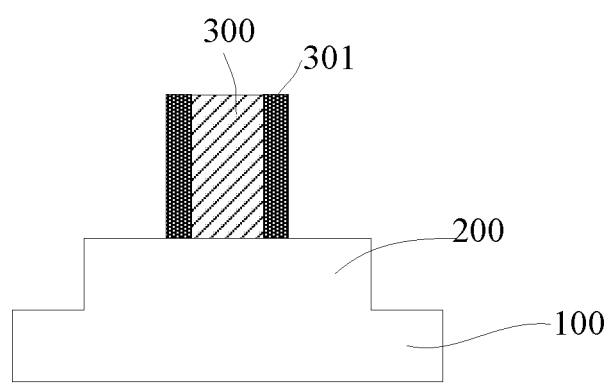

Referring to FIG. 9, a first sidewall spacer 301 may be formed on a sidewall of the dummy gate structure 300 (e.g., in S404 of FIG. 13).

In one embodiment, the first sidewall spacer 301 may be a single-layer structure. In other embodiments, the first sidewall spacer 301 may be a stacked-layer structure.

In one embodiment, the material of the first sidewall spacer 301 may be silicon nitride. In other embodiments, the material of the first sidewall spacer 301 may also be silicon oxide, silicon carbide, silicon oxycarbide, silicon carbide, or a combination thereof.

The first sidewall spacer 301 may be used to define a position of a source/drain doped layer formed subsequently. The first sidewall spacer 301 may be used to protect the sidewall of the dummy gate structure 300 and avoid the topographical defect of the metal gate structure when the dummy gate structure 300 is subsequently removed to form the metal gate structure, where the defect may affect the electrical performance of the semiconductor device.

In one embodiment, a first sidewall spacer material of the first sidewall spacer 301 may be formed by an atomic layer deposition method, and the process parameters may include: an applied gas including a DCS gas doped with $SiH_2Cl_2$ or an ammonia gas ($NH_3$), a flow rate of the gas of about 1500 sccm to about 4000 sccm, and a temperature of about 200° C. to about 600° C.

In one embodiment, the first sidewall spacer material may be etched to form the first sidewall spacer 301 till exposing the substrate 100 and the top of the dummy gate structure 300. In the etching process, carbon tetrafluoride ($CF_4$), fluoromethane ($CH_3F$), and oxygen ($O_2$) may be selected as the etching gas; the gas flow rate range of the carbon tetrafluoride (CF4) gas may be about 5 sccm to about 100 sccm; the gas flow rate range of the fluoromethane ($CH_3F$) gas may be about 8 sccm to about 250 sccm; and the gas flow rate range of the oxygen ($O_2$) may be about 10 sccm to about 400 sccm; the source RF power range may be about 50 W to 300 W; the voltage range may be about 30 V to 100 V; the etching treatment time may be about 4 s to about 50 s; and the etching pressure may be about 10 mtorr to about 2000 mtorr.

In one embodiment, the thickness of the first sidewall spacer 301 may be about 3 nm to about 8 nm.

In one embodiment, when the thickness of the first sidewall spacer 301 is less than 3 nm, the sidewall topography of the dummy gate structure 300 may not be protected in the subsequent process because the thickness of the first sidewall spacer 301 is excessively small. Furthermore, since the thickness of the first sidewall spacer 301 is excessively small, the position for defining the subsequently formed source/drain doped layer may be excessively close to the position of the metal gate structure, which may affect the electrical performance of the formed semiconductor device. When the thickness of the first sidewall spacer 301 is greater than 8 nm, the thickness of the first sidewall spacer 301 may be excessively large, which may waste the material of the first sidewall spacer 301. In addition, the thickness of the first sidewall spacer 301 may be excessively large, the position for defining the subsequently formed source/drain doped layer may be excessively away from the position of the metal gate structure, which may not be advantageous to form the semiconductor device with high integration level.

Figure 10:
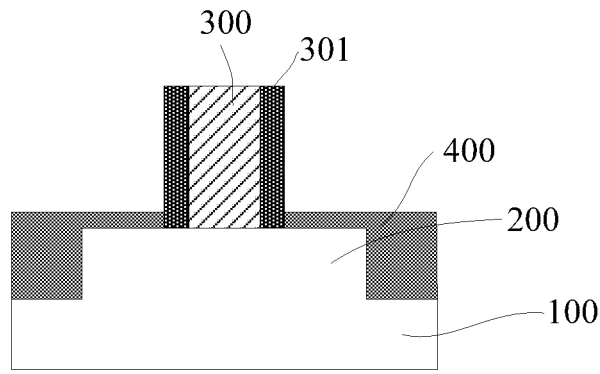

Referring to FIG. 10, an interlayer dielectric layer 400 may be formed on the substrate 100 and the fins 200, and on a portion of the sidewall of the first sidewall spacer 301, and the top of the interlayer dielectric layer 400 may be lower than the top of the first sidewall spacer 301 (e.g., in S405 of FIG. 13).

In one embodiment, the material of the interlayer dielectric layer 400 may be silicon carbide. In other embodiments, the material of the interlayer dielectric layer 400 may be silicon oxide, silicon oxynitride, silicon nitride, or a combination thereof.

The interlayer dielectric layer 400 may be formed by the following steps.

In another embodiment, a dielectric film may be formed on the substrate between adjacent fins, on sidewalls and portions of top surfaces of the fins, and on a sidewall of the first sidewall spacer, and on the top surfaces of the first sidewall spacer and the dummy gate structure 300.

In one embodiment, the dielectric film may be formed by a chemical vapor deposition (PVD) process. The parameters for forming the initial dielectric film may include: an applied gas including $O_2$, $NH_3$, and $N(SiH_3)$, a flow rate of $O_2$ of about 20 sccm to about 10000 sccm, a flow rate of $NH_3$ of about 20 sccm to about 10000 sccm, a flow rate of $N(SiH_3)$ of about 20 sccm to about 10000 sccm, a chamber pressure of about 0.01 torr to about 10 torr, and a temperature of about 30° C. to about 90° C.

In other embodiments, the dielectric film may be formed by a method including an atomic layer deposition, a plasma enhanced chemical vapor deposition, and the like.

In various embodiment, the dielectric film may be further processed to form an initial interlayer dielectric layer having a top coplanar with the top of the first sidewall spacer 301. In one embodiment, a chemical mechanical polishing method is used to form the initial interlayer dielectric layer. The chemical mechanical polishing method may combine advantages of the chemical polishing and the mechanical polishing and may ensure the the initial interlayer dielectric layer having high surface flatness for forming desirable semiconductor devices.

In another embodiment, a mechanical polishing method may be used to process the dielectric film to form the initial interlayer dielectric layer.

In one embodiment, the initial interlayer dielectric layer may be further dry etched to form the interlayer dielectric layer 400 having the top lower than the top of the first sidewall spacer 301. The process parameters of etching the initial interlayer dielectric layer may include the etching gas having helium (He), ammonia ($NH_3$) and nitrogen trifluoride ($NF_3$), where the gas flow rate range of He may be about 600 sccm to about 2000 sccm; the gas flow rate range of $NH_3$ may be about 200 sccm to about 5000 sccm; the gas flow rate range of $NF_3$ may be about 20 sccm to about 2000 sccm; the etching pressure may be about 2 mtorr to about 100 mtorr; and the etching treatment time may be about 20 s to about 1000 s.

Referring to FIG. 11, a second sidewall spacer 302 may be formed on the interlayer dielectric layer 400 and a corresponding sidewall of the first sidewall spacer 301 (e.g., in S406 of FIG. 13).

In one embodiment, the second sidewall spacer 302 may be a single-layer structure. In other embodiments, the second sidewall spacer 302 may be a stacked-layer structure.

In one embodiment, a material of the second sidewall spacer 302 may be silicon nitride. In other embodiments, the material of the second sidewall spacer 302 may also be silicon oxide, silicon carbide, silicon oxycarbide, silicon carbide, or a combination thereof.

In one embodiment, the thickness of the second sidewall spacer 302 may be about 2 nm to about 6 nm.

In one embodiment, when the thickness of the second sidewall spacer 302 is less than 2 nm, since the thickness of the second sidewall spacer 302 is excessively small, the distance between the metal gate structure and the conductive plug may be excessively small when subsequently forming the metal gate structure and the conductive plug. Therefore, the parasitic capacitance between the metal gate structures may not be effectively reduced, and the interference effect caused by the parasitic capacitance may not be reduced, which may not improve the performance stability of the semiconductor device. When the thickness of the second sidewall spacer 302 is greater than 6 nm, the thickness of the second sidewall spacer 302 may be excessively large, which may waste the material of the second sidewall spacer 302. In addition, the thickness of the second sidewall spacer 302 may be excessively large, which may not be advantageous to form the semiconductor device with high integration level and may also affect the electrical performance of the formed semiconductor device.

Referring to FIG. 12, the source/drain region 500 may be formed in the fins 200 on both sides of the dummy gate structure 300.

In one embodiment, when subsequently removing the dummy gate structure 300 to form the metal gate structure and forming the conductive plug at the source/drain region 500, the distance between the metal gate structure and the conductive plug may be increased due to the presence of the second sidewall spacer 302, which may reduce the parasitic capacitance between the metal gate structures. In such way, since the interference effect of the parasitic capacitance is reduced, the alternating current characteristics of the semiconductor device may be enhanced, and the performance stability of the semiconductor device may be improved.

A semiconductor device formed by the above-mentioned embodiments of the present disclosure may include: a substrate 100; a plurality of fins 200 formed on the substrate 100; a dummy gate structure 300 formed across fins 200 and on the substrate 100; a first sidewall spacer 301 formed on the substrate 100 and on a sidewall of the dummy gate structure 300; an interlayer dielectric layer 400 formed on the substrate 100 and the fins 200, and on a sidewall of the first sidewall spacer 301, where a top of the interlayer dielectric layer 400 may be lower than a top of the first sidewall spacer 301; and a second sidewall spacer 302 formed on the interlayer dielectric layer 400 and on a sidewall of the first sidewall spacer 301.

From the above-mentioned embodiments, it can be seen that the technical solution provided by the present disclosure may achieve at least the following beneficial effects.

After forming the first sidewall spacer on the sidewall of the dummy gate structure, the interlayer dielectric layer may be formed on the substrate, and the top of the interlayer dielectric layer is lower than the top of the first sidewall spacer. The second sidewall spacer may be formed on the interlayer dielectric layer and on the sidewall of the first sidewall spacer. When subsequently replacing the dummy gate structure with the metal gate structure and forming the conductive plug, the distance between the metal gate structure and the conductive plug may be increased due to the presence of the second sidewall spacer, which may reduce the parasitic capacitance between the metal gate structures, such that the alternating current characteristics of the semiconductor device may be enhanced and the performance stability of the semiconductor device may be improved.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A semiconductor device, comprising:
a substrate;
a plurality of fins, formed on the substrate;
a dummy gate structure, formed across the plurality of fins and on the substrate;
a first sidewall spacer, formed on a sidewall of the dummy gate structure;
an interlayer dielectric layer, formed on a surface portion of each fin adjacent to the first sidewall spacer to cover a lower portion of a sidewall of the first sidewall spacer;
a second sidewall spacer, formed on a top of the interlayer dielectric layer and covering a remaining portion of the sidewall of the first sidewall spacer, wherein the top of the second sidewall spacer is coplanar with a top of the first sidewall spacer and the top of the dummy gate structure, and the interlayer dielectric layer isolates the second sidewall spacer from an adjacent fin of the plurality of fins; and
a source region and a drain region, formed in the fins on sides of the dummy gate structure, wherein each of the source region and the drain region is formed passing through an entire thickness of the interlayer dielectric layer that is located on the surface portion of each fin.

2. The device according to claim 1, wherein:
the first sidewall spacer includes a single-layer structure or a stacked-layer structure.

3. The device according to claim 2, wherein:
the first sidewall spacer is made of a material including silicon oxide, silicon nitride, silicon carbide, silicon oxycarbide, or a combination thereof.

4. The device according to claim 1, wherein:
a thickness of the first sidewall spacer is about 3 nm to about 8 nm.

5. The device according to claim 1, wherein:
the second sidewall spacer includes a single-layer structure or a stacked-layer structure.

6. The device according to claim 5, wherein:
the second sidewall spacer is made of a material including silicon nitride, silicon oxide, silicon oxycarbide, silicon oxynitride, or a combination thereof.

7. The device according to claim 1, wherein:
a thickness of the second sidewall spacer is about 2 nm to about 6 nm.

8. The device according to claim 1, wherein:
the interlayer dielectric layer is made of a material including silicon oxide, silicon carbide, silicon oxynitride, silicon nitride, or a combination thereof.

9. The device according to claim 1, further including:
conductive plugs, formed over the source/drain region.

10. The device according to claim 1, wherein:
each of the source region and the drain region is located on a side of the second sidewall spacer away from the dummy gate structure.

11. The device according to claim 1, wherein the dummy gate structure includes a dummy gate dielectric layer and a dummy gate electrode layer.

12. A semiconductor device, comprising: The device according
a substrate;
a plurality of fins, formed on the substrate;
a dummy gate structure, formed across the plurality of fins and on the substrate;
a first sidewall spacer, formed on a sidewall of the dummy gate structure;
an interlayer dielectric layer, formed on a surface portion of each fin adjacent to the first sidewall spacer to cover a lower portion of a sidewall of the first sidewall spacer; and
a second sidewall spacer, formed on a top of the interlayer dielectric layer and covering a remaining portion of the sidewall of the first sidewall spacer, wherein the top of the second sidewall spacer is coplanar with a top of the first sidewall spacer and the top of the dummy gate structure, and the interlayer dielectric layer isolates the second sidewall spacer from an adjacent fin of the plurality of fins, wherein:
the interlayer dielectric layer includes a portion formed in contact with a surface of the substrate and in the fin between the dummy gate structure and an adjacent dummy gate structure.

13. The device according to claim 12, wherein:
source/drain regions are formed in the fins on sides of the dummy gate structure.

14. The device according to claim 13, wherein:
each of the source region and the drain region is formed passing through an entire thickness of the interlayer dielectric layer that is located on the surface portion of each fin.

15. The device according to claim 12, wherein:
the first sidewall spacer includes a single-layer structure or a stacked-layer structure.

16. The device according to claim 15, wherein:
the first sidewall spacer is made of a material including silicon oxide, silicon nitride, silicon carbide, silicon oxycarbide, or a combination thereof; and/or
a thickness of the first sidewall spacer is about 3 nm to about 8 nm.

17. The device according to claim 12, wherein:
the second sidewall spacer includes a single-layer structure or a stacked-layer structure.

18. The device according to claim 17, wherein:
the second sidewall spacer is made of a material including silicon nitride, silicon oxide, silicon oxycarbide, silicon oxynitride, or a combination thereof; and/or
a thickness of the second sidewall spacer is about 2 nm to about 6 nm.

19. The device according to claim 12, wherein:
the interlayer dielectric layer is made of a material including silicon oxide, silicon carbide, silicon oxynitride, silicon nitride, or a combination thereof.

* * * * *